(12) United States Patent
Melendez

(10) Patent No.: US 6,323,651 B2
(45) Date of Patent: *Nov. 27, 2001

(54) DIAGNOSTIC TRAILER CENTER DEVICE

(76) Inventor: Robert Melendez, 701 SW. Fourth Ct., Hallandale, FL (US) 33009-6219

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/359,687

(22) Filed: Jul. 23, 1999

Related U.S. Application Data

(60) Provisional application No. 60/094,577, filed on Jul. 29, 1998.

(51) Int. Cl.[7] .................................................. G01R 31/00
(52) U.S. Cl. .......................................................... 324/504
(58) Field of Search ...................................... 324/503, 504, 324/555, 556; 73/121, 129

(56) References Cited

U.S. PATENT DOCUMENTS

| | | |
|---|---|---|
| 4,771,387 * | 9/1988 | Hexel et al. ............... 364/426.02 |
| 4,897,642 | 1/1990 | Dilullo et al. . |
| 5,025,253 | 6/1991 | Dilullo et al. . |
| 5,086,277 | 2/1992 | Hammerly . |
| 5,142,278 | 8/1992 | Moallemi et al. . |
| 5,397,924 | 3/1995 | Gee et al. . |
| 5,416,421 | 5/1995 | Doland, Sr. et al. . |
| 5,488,352 | 1/1996 | Jasper . |
| 5,488,859 * | 2/1996 | Britt ........................................ 73/121 |
| 5,602,482 | 2/1997 | Gutierrez . |
| 5,604,439 | 2/1997 | Walkington et al. . |
| 5,693,985 | 12/1997 | Gee et al. . |

* cited by examiner

*Primary Examiner*—Safet Metjahic
*Assistant Examiner*—Etienne P LeRoux
(74) *Attorney, Agent, or Firm*—Tipton A. Randall

(57) ABSTRACT

The invention is a device for testing the electrical circuitry on all trailers used in the cargo industry. The device plugs into the electrical connector of a trailer and allows a single mechanic to test and make brake adjustments without the assistance of another individual, to check the operation of all lighting and signal lights of the trailer, and to test the integrity of each electrical circuit and locate shorts in the circuits. An electrical short in a circuit is located by applying a low amperage current, at 12 volts, to the inoperative circuit and locating the warm point in the wiring where the short exists. The brake system adjustments provided by the device include checking sticky or frozen cams, moving the cams while lubricating them, and testing the various valve functions in the air brakes system of the cargo trailer.

19 Claims, 3 Drawing Sheets

DIAGNOSTIC TRAILER CENTER DEVICE

CROSS REFERENCE TO RELATED APPLICATION

This application claims the benefit under 35 U.S.C. §119 (e) of co-pending provisional application Ser. No. 60/094,577, filed Jul. 29, 1998. Application Ser. No. 60/094,577 is hereby incorporated by reference.

FIELD OF THE INVENTION

The invention relates to a diagnostic device for cargo trailers and, more particularly, to a device for testing both electrical circuits and braking systems of a cargo trailer.

BACKGROUND OF THE INVENTION

Cargo hauling trailers drawn by over the road tractors are equipped with many signaling and safety features. Illuminated signaling lamps include brake lights, turn signals, and running lights. Safety features also include pneumatic braking systems, including primary braking and emergency braking systems. Trailers must be periodically inspected for proper operation of these signaling and braking systems. Breaks in the electrical wiring or in the pneumatic hoses are common problems which arise. Corrosion of electrical connections or of braking system components are also frequently encountered.

One way of testing and observing these systems is to connect a towing vehicle, such as a tractor trailer, to the trailer. A tractor has the voltage and pneumatic sources for operating the systems. An observer can activate the various systems individually, and then observe the results. This method can be quite inefficient, since it relies upon the presence of an unused tractor and also requires time to make connections and carry out the cumbersome processes of manually activating each system, before then walking around the trailer to verify proper performance.

A number of patents concerned with monitoring and testing systems for vehicles, including cargo trailers and attached tractors are known. DiLullo et al., in U.S. Pat. Nos. 4,897,642 and 5,025,253, describe a system and method for remotely monitoring the status and location of multiple part vehicles using satellite communications. In U.S. Pat. No. 5,142,278, Moallemi et al. disclose an apparatus and method for communication between a tractor and trailer via existing truck wiring, and transmitting the status to a remote receiver. Gee et al., in U.S. Pat. Nos. 5,397,924 and 5,693,985, describe a truck tractor and trailer communication system that uses a standard seven pin connector where high speed data communication links are employed for control and diagnostics of the electrical system. In U.S. Pat. No. 5,488,352, Jasper discloses a communications channel that interconnects controllers located in a tractor and a trailer unit. The controllers monitor and control various subsystems of the tractor/trailer combination.

An apparatus and method for performing diagnostic tests on the electrical systems of recreational vehicles is disclosed by Hammerly in U.S. Pat. No. 5,086,277. The device contains switches and LEDs plus a voltmeter and an ammeter for use in testing the circuits. A simple trailer lamp testing and lamp storage apparatus is described by Doland, Sr., et al. in U.S. Pat. No. 5,416,421. Walkington et al., in U.S. Pat. No. 5,604,439, disclose a tractor/trailer lamp circuit continuity test device with LEDs to indicate if the lamps are operating. Gutierrez, in U.S. Pat. No. 5,602,482, discloses a trailer system tester that includes a portable diagnostic device for checking electrical signaling systems for trailers. Also included on the device is a pneumatic system to pressurize the air breaks of the trailer for leak testing. The use of vacuum or hydraulic breaks is also mentioned.

Thus, there is an unmet need for a device that will allow an individual to test both the electrical circuits and the pneumatic braking systems of a cargo trailer, as well as assist the individual in locating trouble spots in any of these systems.

SUMMARY OF THE INVENTION

The invention is a device for testing the electrical circuitry on all trailers used in the cargo industry. The device plugs into the electrical connector of a trailer and allows a single mechanic to test and make break adjustments without the assistance of another individual, to check the operation of all lighting and signal lights of the trailer, and to test the integrity of each electrical circuit and locate shorts in the circuits.

The electrical and pneumatic diagnostic device comprises a housing member enclosing an electrical circuitry for testing the electrical and pneumatic systems of cargo hauling trailers. A power supply means is connectable to the electrical circuitry for supplying nominal 12 volt direct current thereto. A first set of sub-circuits is contained in the electrical circuitry, with each sub-circuit serving a selected illumination and signaling lighting circuit of the trailer. A second set of sub-circuits is contained in the electrical circuitry, with these sub-circuits serving the pneumatic system of the trailer. A means for connecting the first and second sets of sub-circuits to the electrical system of the trailer is present. A switch means is present for selectively powering the first set or the second set of sub-circuits. The first set of sub-circuits each has a control switch means for powering a corresponding trailer electrical circuit, and each sub-circuit has a visual indicator means for denoting sub-circuit power. There is a conduit with a valve for supplying compressed air to a sealed conduit in the housing, with first and second fittings on the sealed conduit for connection to the service and emergency hoses of the cargo trailer braking system. The second set of sub-circuits contains a timer means for periodically actuating the valve that actuates the cargo trailer braking system at a selected time interval.

Any electrical short in a circuit is located by applying a low amperage current, at 12 volts, to the inoperative circuit and locating the warm point in the wiring where the short exists. The break system adjustments provided by the device include checking sticky or frozen cams, moving the cams while lubricating them, and testing the various valve functions in the air breaks system of the cargo trailer.

DESCRIPTION OF THE PREFERRED EMBODIMENTS

Nomenclature

| | |
|---|---|
| 1 | 11.5 to 12.6 Volt Transformer |
| 2 | Diode Bridge |
| 3 | Filtering Capacitor |
| 4 | Flasher |
| 5 | Volt Meter |
| 6 | 1.25K Resistor, 25 Watts |
| 7 | 1.25K Resistor, 25 Watts |
| 8 | 1.25K Resistor, 25 Watts |
| 9 | Double Pole Double Throw Switch |
| 10 | Relay |
| 11 | Relay |
| 12 | Capacitor |
| 13 | Capacitor |
| 14 | Single Pole Single Throw Switch |
| 15 | Single Pole Single Throw Switch |
| 16 | Single Pole Single Throw Switch |
| 17 | Single Pole Single Throw Switch |
| 18 | Single Pole Single Throw Switch |
| 100 | Control Panel |
| 102 | Electrical Supply Line Plug |
| 104 | Electrical Plug Connector to Trailer |
| 105 | Meter |
| 106 | ON/OFF Toggle Switch |
| 108 | Electrically Controlled Air Valve for Pneumatic Line |
| 110 | Service Hose Fitting for Pneumatic Lines |
| 112 | Emergency Hose Fitting for Pneumatic Lines |
| 114 | Visual Indicator Means for Right Signal |
| 115 | Visual Indicator Means for Left Signal |
| 116 | Visual Indicator Means for Brake (Stop) Lights |
| 117 | Visual Indicator Means for Clearance Lights |
| 118 | Visual Indicator Means for Marker Lights |
| 120 | Air Supply Line for Pneumatic Hose Fittings |

Construction

Figure 1:
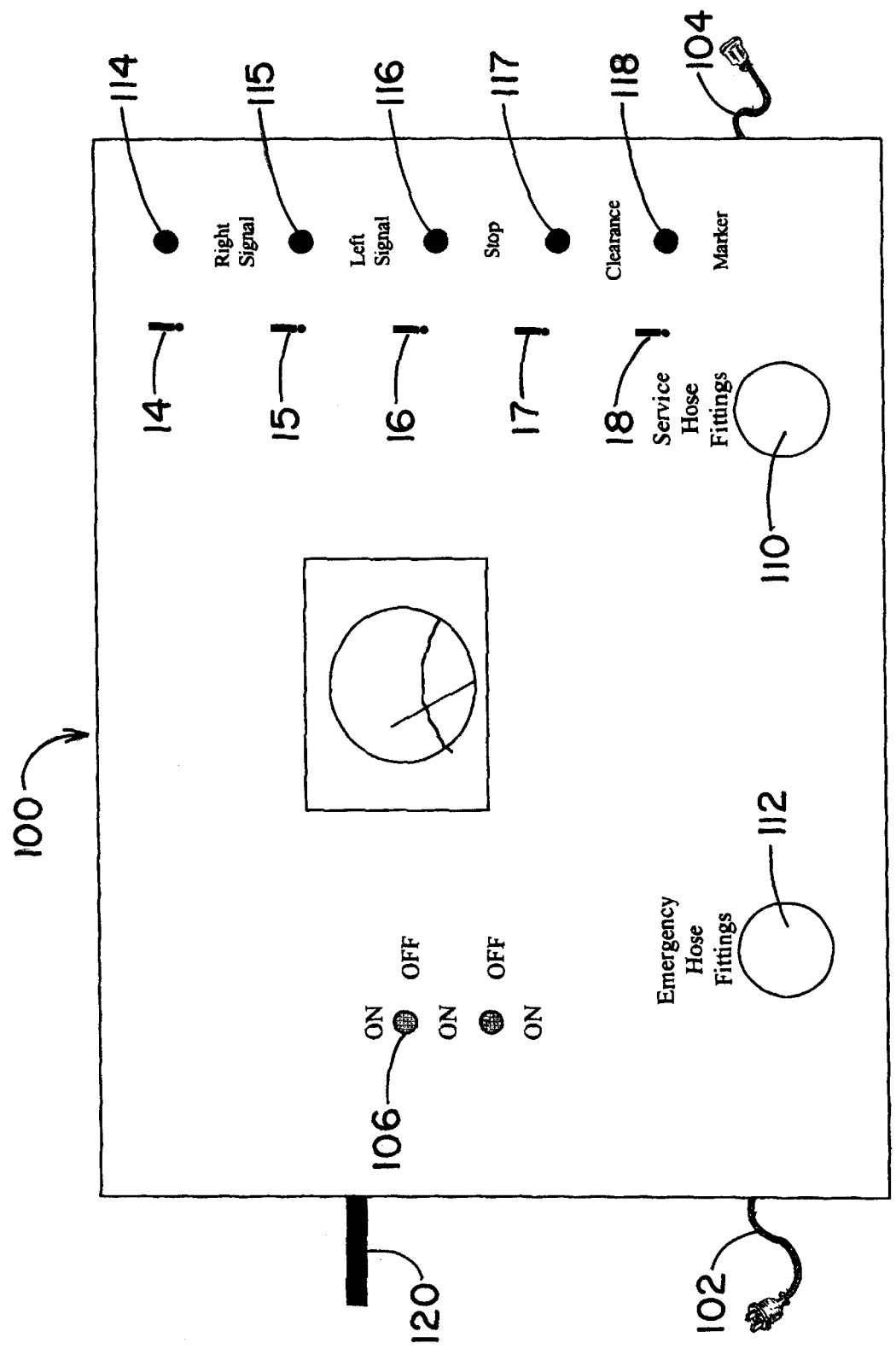
FIG. 1 is as a top view of the control panel of the diagnostic device of the present invention.

The invention is depicted in the attached Figures. The device contains an electrical plug connector which the operator plugs into the trailer light receptacle, as well as pneumatic fittings that accept the trailer's braking system service hose and the braking system emergency hose. Referring to FIG. 1, a top view of the control panel 100 of the diagnostic device of the present invention is shown. The control panel 100 contains an electrical line plug 102 which is connected to a standard 120 volt AC circuit, providing power to the diagnostic device. An electrical plug connector 104 is present, which plugs into the trailer light receptacle (not shown). The control panel 100 also contains a volt meter 105 and a double pole double throw switch 106 for selectively activating either the electrical circuit diagnostic function, or the pneumatic braking diagnostic function. The throw switch 106 is configured to energize a transformer with 120 volt alternating current (AC), thereby producing 12 volt direct current (DC) for the trailer electrical system, when either the electrical circuit diagnostic function, or the pneumatic braking diagnostic function is selected or "ON". The control panel 100 also contains a service hose fitting 110 and an emergency hose fitting 112 to which are connected the service and emergency pneumatic lines from the trailer (not shown). Air for supplying the service and emergency pneumatic systems for braking is provided by an air supply line 120, connected to a compressed air source (not shown).

Control panel 100 also contains five single pole single throw toggle switches used to selectively actuate and test the electrical circuits of the trailer. The toggle switches are arranged as follows; for the right signal circuit, toggle switch 14; for the left signal circuit, toggle switch 15; for the stop or brake signal circuit, toggle switch 16; for the clearance lights circuit, toggle switch 17 and for the marker lights circuit, toggle switch 18. A visual indicator means, mounted on the control panel 100, is contained in each electrical sub-circuit to show that the sub-circuit is powered when the corresponding toggle switch is deflected to one side. The visual indicator means 114, 115, 116, 117 and 118 correspond to the toggle switches 14–18 respectively. The visual indicator means 114–118 can be small incandescent bulbs, or light emitting diodes (LEDs).

Figure 2:
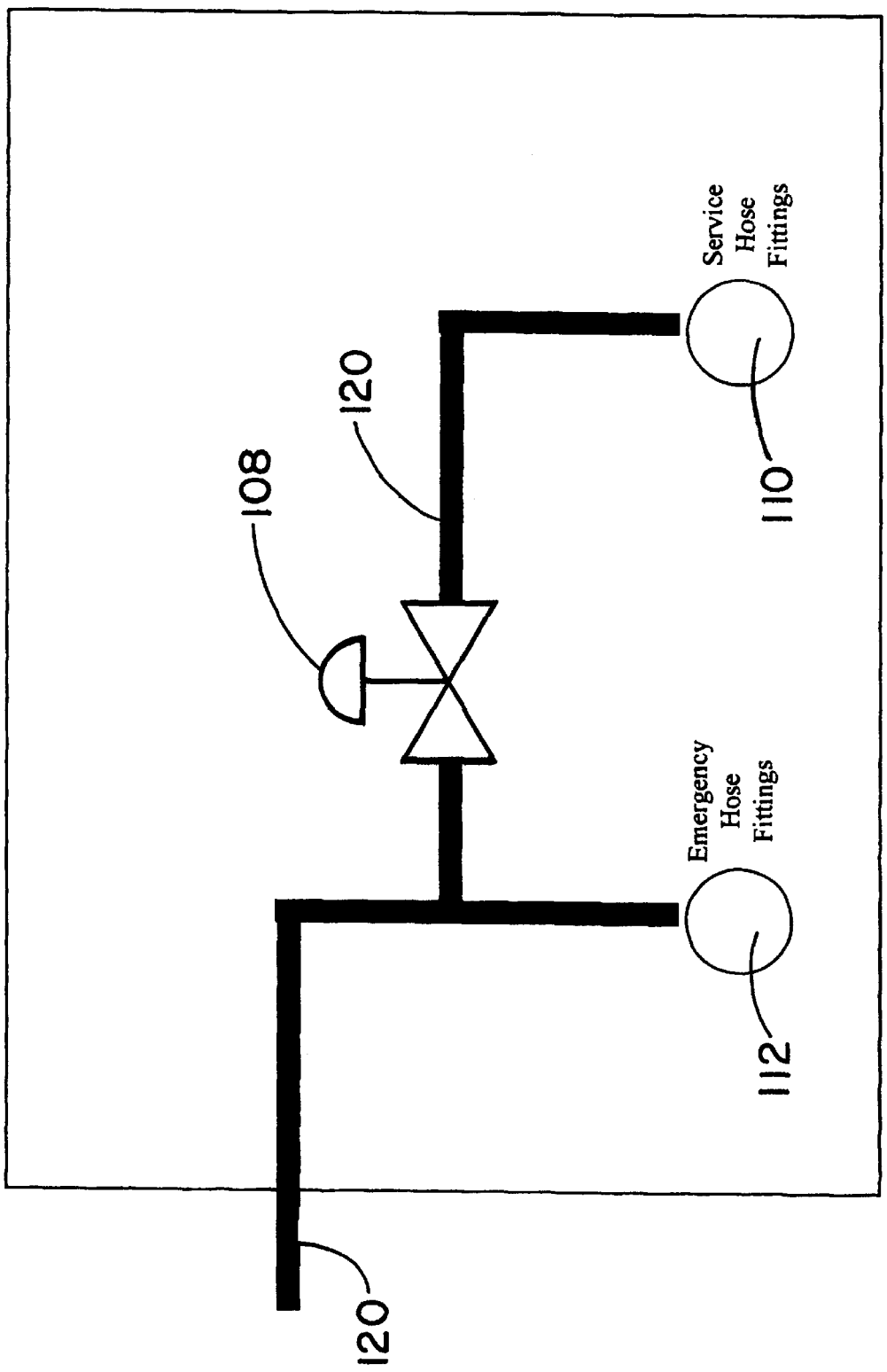
FIG. 2 is a diagram of the pneumatic air supply lines of the device.

FIG. 2 shows the air supply conduit 120 fitted with an electrically controlled valve 108 which supplies the service hose fitting 110 mounted on the control panel 100.

Figure 3:
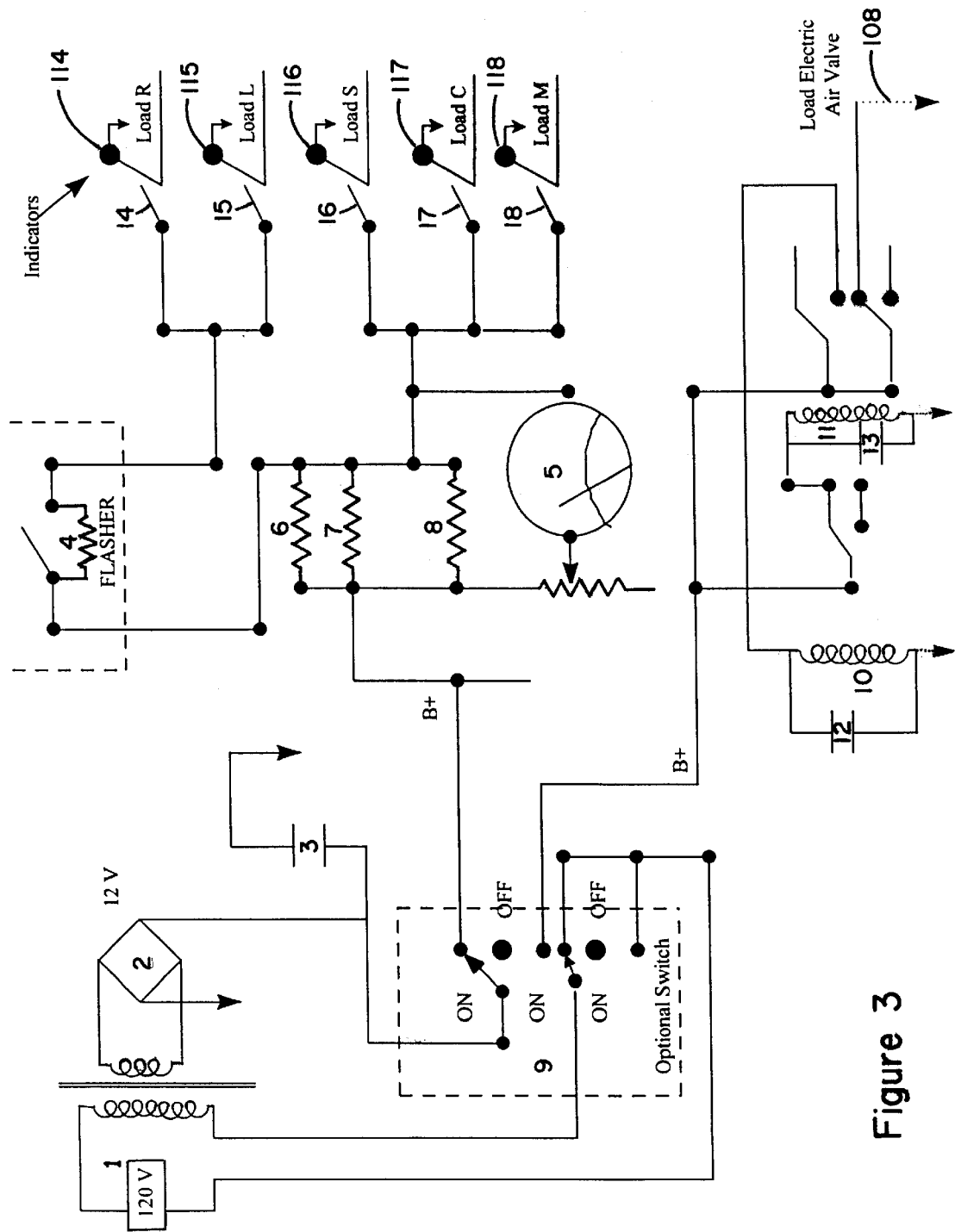
FIG. 3 is an electrical schematic drawing of the circuitry of the diagnostic device.

Referring to FIG. 3, the electrical schematic drawing of the circuitry of the diagnostic device is shown. The standard 120 volt AC supplied by electrical supply line 102 is converted to nominal 12 volt DC by a transformer 1 and a diode bridge 2. The 12 volt direct current and 120 volt alternating current are controlled by the double pole double throw switch 9 which selectively provides current to either the sub-circuit for testing the electrical circuits of the trailer, or to the sub-circuit for testing the pneumatic braking system. With regard to the electrical circuit testing, single pole single throw toggle switches 14, 15, 16, 17 and 18 are used to selectively energize the right turn circuit, left turn circuit, braking circuit, clearance lights circuit, and marker lights circuit respectively. The electrical sub-circuit includes a flasher 4 for testing the right and left turn signal circuits, and a meter 5 for indicating operation of one or two signaling/braking bulbs.

The pneumatic braking system electrical sub-circuit of the diagnostic device contains a timer circuit means to periodically activate the electric air valve 108 which actuates the pneumatic braking system of the trailer. The timer circuit means of FIG. 3 is composed of one relay 10 and capacitor 12 pair and another relay 11 and capacitor 13 pair, although other timer circuit means are contemplated that accomplish the same function.

The device is activated by turning the double throw switch 106 to one of the "ON" positions. To check the electrical lighting circuits, the operator plugs the electrical plug connector 104 into the trailer receptacle (not shown) and then turns the switch 9 to the electrical circuit testing position. The operator in turn closes and opens the toggle switches 14–18 to actuate each electrical circuit on the trailer lighting system. The meter 5 measures current draw on the brake and signal lamps. A parallel network of resistors 6, 7, and 8 provides short circuit protection and regulates circuit current to any circuit with a short in the wiring. With one of the trailer electrical sub-circuits receiving power, a low amperage current warms the wire at the point of the short, providing the operator with a means of locating the short by tracing the wire of that sub-circuit and feeling for the warm spot in the wire.

To check the pneumatic braking system, the operator connects the service and emergency pneumatic supply lines from the trailer to the service hose fitting 110 and the emergency hose fitting 112 on the control panel 100, then turns the switch 9 to the brake system testing position. The timer circuit means, composed of one relay 10 and capacitor 12 pair and another relay 11 and capacitor 13 pair, actuates the valve means 108 to actuate the trailer braking system at specified time intervals. For instance, with a time interval of 7 seconds, the pneumatic brakes are applied at 7, 14, 21, 28, . . . etc, seconds. Other time intervals may be selected, at the discretion of the user. The timer circuit means causes an electric air valve 108 in the compressed air line supply line 120 to open and close at the various time intervals. The circuit is deactivated and the timer function reset to zero by moving the switch 9 to the off position. The operator may then again power the braking circuit to further test or service the pneumatic braking system. Other timer circuit means to accomplish the described functions are also contemplated. A simple printed circuit board device is commercially available and may be substituted for the shown timer circuit means.

The application of the braking system at selected time intervals allows the operator to check for sticky or frozen cams in the braking system. Also, the cams can be lubricated during the activation cycle, increasing the ease of this maintenance task. In addition, during the pneumatic braking system selected time interval test cycle, the operator can determine if the air emergency valve is slow to fill the air tank, check for an inoperative service valve, and inspect the system for air leaks. Further, it may be desirable to position the wheels of the trailer on a powered roller device which rotates the wheels. The operator can then easily test and adjust the pneumatic braking system under 100% road simulation conditions.

While the invention has been particularly shown and described with reference to a preferred embodiment thereof, it will be understood by those skilled in the art that various changes in form and details may be made therein without departing from the spirit and scope of the invention.

I claim:

1. An electrical and pneumatic diagnostic device for servicing the electrical and pneumatic systems of cargo hauling trailers comprising;
   (a) a housing member enclosing an electrical circuitry adapted for testing the electrical and pneumatic systems of cargo hauling trailers;
   (b) power supply means connectable to said electrical circuitry for supplying nominal 12 volt direct current thereto;
   (c) a first set of sub-circuits contained in said electrical circuitry, each sub-circuit of said first set serving a selected illumination and signaling lighting circuit of the trailer;
   (d) a second set of sub-circuits contained in said electrical circuitry, said sub-circuits of said second set for periodically actuating the pneumatic system of the trailer;
   (e) means for connecting said first set of sub-circuits to the trailer electrical system;
   (f) switch means for selectively powering said first set or said second set of sub-circuits;
   (g) said first set of sub-circuits each having control switch means for powering a corresponding trailer electrical circuit, and each having visual indicator means for denoting sub-circuit power;
   (h) conduit with a valve means for supplying compressed air to first and second fittings on said housing member, said first and second fittings adapted for connection to the trailer pneumatic braking system service and emergency hoses; and
   (i) said second set of sub-circuits containing timer circuit means for periodically actuating said valve means of said supply conduit, thereby actuating the trailer pneumatic braking system at selected time intervals.

2. The diagnostic device for servicing cargo hauling trailers of claim 1, wherein, said power supply means comprises a transformer member supplied with 120 volt alternating current and producing nominal 12 volt direct current for said enclosed electrical circuitry.

3. The diagnostic device for servicing cargo hauling trailers of claim 2, wherein said switch means for selectively powering said sets of sub-circuits also selectively powers said transformer member with 120 volt alternating current.

4. The diagnostic device for servicing cargo hauling trailers of claim 1, further comprising a flasher operably connected to at least one said sub-circuit of said first set, connected to a conductor corresponding to a turning signal circuit of the trailer, for transmitting an intermittent power signal to a corresponding said sub-circuit of said diagnostic device.

5. The diagnostic device for servicing cargo hauling trailers of claim 1, wherein, said visual indicator means for denoting sub-circuit power for each said first set of sub-circuits comprises an individual light emitting member contained in each said sub-circuits.

6. The diagnostic device for servicing cargo hauling trailers of claim 1, further comprising a meter member contained in said first set of sub-circuits, said meter member indicating the number of powered trailer signaling or illumination bulbs.

7. The diagnostic device for servicing cargo hauling trailers of claim 1, wherein, said timer circuit means comprises first and second pairs of a relay plus a capacitor contained in said second set of sub-circuits.

8. The diagnostic device for servicing cargo hauling trailers of claim 1, wherein, said timer circuit means actuates said valve means of said supply conduit, thereby actuating the trailer pneumatic braking system at a selected time interval, and consecutively at whole number multiples of said time interval.

9. An electrical and pneumatic diagnostic device for servicing the electrical and pneumatic systems of cargo hauling trailers comprising;
   (a) a housing member enclosing an electrical circuitry adapted for the testing electrical and pneumatic systems of cargo hauling trailers;
   (b) a transformer member supplied with 120 volt alternating current and producing nominal 12 volt direct current for said enclosed electrical circuitry;
   (c) a first set of sub-circuits contained in said electrical circuitry, each sub-circuit of said first set serving a selected illumination and signaling lighting circuit of the trailer;
   (d) a second set of sub-circuits contained in said electrical circuitry, said sub-circuits of said second set for periodically actuating the pneumatic system of the trailer;
   (e) means for connecting said first set of sub-circuits to the trailer electrical system;
   (f) switch means for selectively powering said first set or said second set of sub-circuits;
   (g) said first set of sub-circuits each having control switch means for powering a corresponding trailer electrical circuit, and each having visual indicator means for denoting sub-circuit power;
   (h) conduit with a valve means for supplying compressed air to first and second fittings on said housing member, said first and second fittings adapted for connection to the trailer pneumatic braking system service and emergency hoses; and
   (i) said second set of sub-circuits containing timer circuit means for periodically actuating said valve means of said supply conduit, thereby actuating the trailer pneumatic braking system at selected time intervals.

10. The diagnostic device for servicing cargo hauling trailers of claim 9, wherein said switch means for selectively powering said sets of sub-circuits also selectively powers said transformer member with 120 volt alternating current.

11. The diagnostic device for servicing cargo hauling trailers of claim 9, further comprising a flasher operably connected to at least one said sub-circuit of said first set, connected to a conductor corresponding to a turning signal circuit of the trailer, for transmitting an intermittent power signal to a corresponding said sub-circuit of said diagnostic device.

12. The diagnostic device for servicing cargo hauling trailers of claim 9, wherein, said visual indicator means for denoting sub-circuit power for each said first set of sub-circuits comprises an individual light emitting member contained in each said sub-circuits.

13. The diagnostic device for servicing cargo hauling trailers of claim 9, further comprising a meter member contained in said first set of sub-circuits, said meter member indicating the number of powered trailer signaling or illumination bulbs.

14. The diagnostic device for servicing cargo hauling trailers of claim 9, wherein, said timer circuit means comprises first and second pairs of a relay plus a capacitor contained in said second set of sub-circuits.

15. The diagnostic device for servicing cargo hauling trailers of claim 9, wherein, said timer circuit means actuates said valve means of said supply conduit, thereby actuating the trailer pneumatic braking system at a selected time interval, and consecutively at whole number multiples of said time interval.

16. An electrical and pneumatic diagnostic device for servicing cargo hauling trailers comprising;
 (a) a housing member enclosing an electrical circuitry adapted for testing the electrical and pneumatic systems of cargo hauling trailers;
 (b) a transformer member supplied with 120 volt alternating current and producing nominal 12 volt direct current for said enclosed electrical circuitry;
 (c) a first set of sub-circuits contained in said electrical circuitry, each sub-circuit of said first set serving a selected illumination and signaling lighting circuit of the trailer;
 (d) a second set of sub-circuits contained in said electrical circuitry, said sub-circuits of said second set for periodically actuating the pneumatic system of the trailer;
 (e) means for connecting said first set of sub-circuits to the trailer electrical system;
 (f) switch means for selectively powering said first set or said second set of sub-circuits, and for selectively powering said transformer member with 120 volt alternating current;
 (g) said first set of sub-circuits each having control switch means for powering a corresponding trailer electrical circuit, and each having visual indicator means for denoting sub-circuit power;
 (h) a flasher operably connected to at least one said sub-circuit of said first set, connected to a conductor corresponding to a turning signal circuit of the trailer, for transmitting an intermittent power signal to a corresponding said sub-circuit of said diagnostic device;
 (i) a meter member contained in said first set of sub-circuits, said meter member indicating the number of powered trailer signaling or illumination bulbs;
 (j) conduit with a valve means for supplying compressed air to first and second fittings on said housing member, said first and second fittings adapted for connection to the trailer pneumatic braking system service and emergency hoses; and
 (k) said second set of sub-circuits containing timer circuit means for periodically actuating said valve means of said supply conduit, thereby actuating the trailer pneumatic braking system at selected time intervals.

17. The diagnostic device for servicing cargo hauling trailers of claim 16, wherein, said visual indicator means for denoting sub-circuit power for each said first set of sub-circuits comprises an individual light emitting member contained in each said sub-circuit.

18. The diagnostic device for servicing cargo hauling trailers of claim 16, wherein, said timer circuit means comprises first and second pairs of a relay plus a capacitor contained in said second set of sub-circuits.

19. The diagnostic device for servicing cargo hauling trailers of claim 16, wherein, said timer circuit means actuates said valve means of said supply conduit, thereby actuating the trailer pneumatic braking system at a selected time interval, and consecutively at whole number multiples of said time interval.

* * * * *